United States Patent
Togo

Patent Number: 5,479,697
Date of Patent: Jan. 2, 1996

[54] METHOD FOR MANUFACTURING MAGNETIC PICKUP SENSOR

[75] Inventor: Ichiro Togo, Himeji, Japan

[73] Assignee: Mitsubishi Denki Kabushiki Kaisha, Tokyo, Japan

[21] Appl. No.: 229,438

[22] Filed: Apr. 12, 1994

Related U.S. Application Data

[62] Division of Ser. No. 700, Jan. 5, 1993, Pat. No. 5,418,454.

[30] Foreign Application Priority Data

Jan. 8, 1992 [JP] Japan ..................... 4-001493

[51] Int. Cl.$^6$ ....................................... H01F 41/02
[52] U.S. Cl. ............... 29/606; 29/602.1; 264/272.15; 264/272.16
[58] Field of Search ................... 29/602.1, 607, 29/606; 324/207.15; 264/272.15, 272.16

[56] References Cited

U.S. PATENT DOCUMENTS 5,010,263   4/1991   Murata .

FOREIGN PATENT DOCUMENTS 0282967   9/1988   European Pat. Off. .
227908    6/1990   Japan .

Primary Examiner—Carl E. Hall
Attorney, Agent, or Firm—Sughrue, Mion, Zinn, Macpeak & Seas

[57] ABSTRACT

A magnetic pickup sensor comprising a sensor assembly 11 and a molded resin housing 12 disposed around the assembly. The sensor assembly has a pickup coil 15 wound around an iron core 14 for detecting a change in the magnetic flux of a magnet 13, and a support unit including a coil bobbin 18 and a spacer 20 for supporting the magnet and core assembly. The iron core has one end 14 a projecting outwardly from the molded resin, and the spacer of the support unit has a positioning recess 23 for engagement by a positioning pin 30 of a mold die. Therefore, the sensor assembly can be accurately positioned and held within the mold die during molding of the housing.

5 Claims, 2 Drawing Sheets

METHOD FOR MANUFACTURING MAGNETIC PICKUP SENSOR

This is a divisional of application No. 08/000,700 filed Jan. 5, 1993, now U.S. Pat. No. 5,418,454.

BACKGROUND OF THE INVENTION

This invention relates to a magnetic pickup sensor and, more particularly, to a magnetic pickup sensor in which a magnet-and-coil sensor assembly is disposed within a molded resin housing.

FIGS. 4 and 5 illustrate a known magnetic pickup sensor particularly useful when used for generating an ignition timing signal in internal combustion engines. The illustrated magnetic pickup sensor comprises a sensor assembly 1 and a molded resin housing 2 having a mounting flange 2a disposed around the sensor assembly 1 and defining an outer housing for the sensor assembly 1.

The sensor assembly 1 comprises a substantially disc-shaped permanent magnet 3 as shown in FIG. 5, a magnetic iron core 4 coaxially aligned with the permanent magnet 3 for defining a magnetic path for allowing the passage of the magnetic flux generated from the magnet 3 and a pickup coil 5 wound around the iron core 4 for detecting a change in magnetic flux passing through the iron core 4. The sensor assembly 1 also comprises a support unit 6 for supporting the permanent magnet 3, the iron core 4 and the pickup coil 5 into an assembled state. The sensor assembly 1 has connected thereto an output wire 7.

The support unit 6 comprises a coil bobbin 8 disposed around the iron core 4 and around which the sensor coil 5 is wound, a sleeve 9 attached to the coil bobbin 8 for holding the magnet 3 in magnetic coupling relationship relative to the iron core 4 and a spacer 10 inserted within the sleeve 9 for holding the magnet 3 within the sleeve 9.

During the manufacture of the magnetic pickup sensor, in order to form the molded resin housing 2 around the sensor assembly 1, the sensor assembly 1 must be placed within a mold cavity defined by a mold die as is readily apparent from FIG. 4. In positioning the sensor assembly 1 within the mold cavity, one end 4a of the magnetic iron core 4 which projects from the assembly 1 and from the mold resin housing 2 is positioned within a recess formed in a cavity wall surface so that the projecting end 4a of the iron core 4 is accurately positioned in the mold resin housing 2.

However, as easily understood from FIG. 4, since the sensor assembly 1 is positioned and supported within the mold cavity only at one end of the assembly 1 or the projecting end 4a of the iron core 4, the position of the sensor assembly 1 within the mold cavity is not completely stable and the sensor assembly 1 can quite easily tilt from its correct position with respect to the molded resin housing 2. The output wire 7 connected to the sensor assembly 1 may provide some support for the assembly 1, but the flexibility of the output wire 7 and the position at which the wire 7 is connected to the assembly 1 make the support during the molding procedure insufficient. When the sensor assembly 1 tilts and is moved out of the correct position within the molded resin housing 2, the positional accuracy of the iron core 4 cannot be maintained, which may cause the inaccuracy of the measurement of the sensor assembly 1. When the sensor assembly 1 is tilted and out of correct position within the molded resin housing 2 in the completed magnetic pickup sensor, the measurement accuracy of the sensor assembly 1 is degraded when the molded resin housing 2 is installed relative to the object to be detected by means of a mounting flange 2a.

SUMMARY OF THE INVENTION

Accordingly, one object of the present invention is to provide a magnetic pickup sensor which is free from the above-discussed problems.

Another object of the present invention is to provide a magnetic pickup sensor which is accurate in measurement and which can be easily manufactured.

With the above objects in view, the magnetic pickup sensor comprises a sensor assembly and a molded resin housing disposed around the sensor assembly and defining an outer housing therefor. The sensor assembly comprises a magnet for generating a magnetic flux, an iron core for defining a magnetic path, a pickup coil wound around the iron core for detecting a change in magnetic flux passing through the iron core and a support unit for supporting the magnet, the iron core and the pickup coil into an assembly. The iron core of the sensor assembly has one end projecting outwardly from the mold resin and the support unit has a positioning recess for being engaged by a portion of a mold die for positioning and holding the sensor assembly in place during molding of the mold resin.

The support unit may include a coil bobbin disposed around the iron core and around which the sensor coil is wound, a sleeve attached to the coil bobbin for holding the magnet in magnetic coupling relationship relative to the iron core and a spacer associated with the sleeve for holding the magnet within the sleeve. The spacer is generally drum-shaped having a pair of opposing major planar surfaces and having a positioning recess at each of the opposing planar surfaces.

According to the method for manufacturing a magnetic pickup sensor of the present invention, a support unit having a recessed engagement surface for positioning the support unit is prepared and, in association with the support unit, a magnet, an iron core and a pickup coil are assembled into a sensor assembly for detecting a change in a magnetic flux generated from the magnet and passing through the iron core. Then, the sensor assembly is placed within a mold cavity defined by the mold die, with one end of the iron core of the sensor assembly fitted within a recess formed in a cavity wall of the mold die, and the engagement surface recess of the support unit is engaged by a part of the mold die for positioning and holding the sensor assembly in place during molding of the molded resin. The mold cavity around the sensor assembly is filled with a mold resin for forming a mold resin housing therefor.

BRIEF DESCRIPTION OF THE DRAWINGS

The present invention will become more readily apparent from the detailed description of the preferred embodiment of the present invention taken in conjunction with the accompanying drawings, in which.

DESCRIPTION OF THE PREFERRED EMBODIMENT

Figure 1:
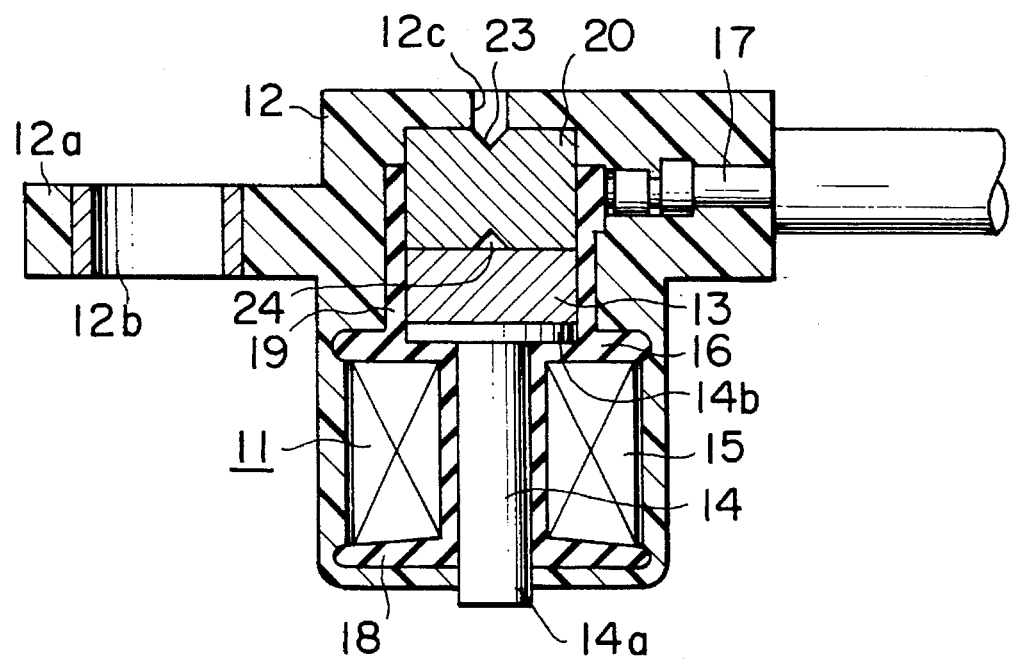
FIG. 1 is a sectional side view of the magnetic pickup sensor of the present invention.
Figure 2:
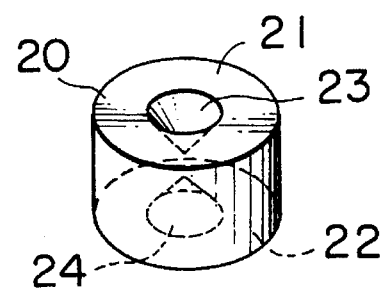
FIG. 2 is a perspective view of the permanent magnet of the magnetic pickup sensor of the present invention.

FIGS. 1 and 2 illustrate a magnetic pickup sensor of the present invention which is particularly suitable for generating an ignition timing signal in an internal combustion engine. It is seen that the illustrated magnetic pickup sensor comprises a sensor assembly 11 and a molded resin housing 12 disposed around the sensor assembly 11 and defining an outer housing for the sensor assembly 11. The molded resin housing 12 has a mounting flange 12a including a through hole 12b for allowing a mounting screw (not shown) to extend therethrough for mounting the magnetic pickup sensor. The molded resin housing 12 also has formed in the top surface thereof a small bore 12c for a purpose which will be described later.

The sensor assembly 11 comprises a substantially drum-shaped permanent magnet 13 and a coaxially disposed magnetic iron core 14 having a projecting end 14a projecting from the housing 12 and a flanged end 14b brought into a magnetically coupled relationship with the permanent magnet 13 for defining a magnetic path for allowing the passage of the magnetic flux generated from the magnet 13. A pickup coil 15 is wound around the iron core 14 for detecting a change in magnetic flux passing through the iron core 14. The sensor assembly 11 also comprises a support unit 16 for supporting the permanent magnet 13, the iron core 14 and the pickup coil 15 into an axially aligned assembly. The sensor assembly 11 has connected thereto an output wire 17 which extends through the molded resin housing 12 for connection to an external circuit (not shown).

The support unit 16 of the sensor assembly 11 comprises an electrically insulating coil bobbin 18 disposed around the iron core 14 and around which the sensor coil 15 is wound and a sleeve 19 integrally attached to the coil bobbin 18 for holding the magnet 13 in a magnetic coupling relationship relative to the iron core 14. The support unit 16 also comprises a spacer 20 inserted within the sleeve 19 for holding the magnet 13 within the sleeve 19. The spacer 20 has a generally drum-shaped configuration having a pair of opposing major planar surfaces 21 and 22 each having a substantially conical positioning recess 23 or 24 as best seen from FIG. 2. The positioning recesses 23 and 24 are for positioning and holding the sensor assembly 11 in place during molding of the resin housing 12 around the sensor assembly 11. Since the opposing major surfaces 21 and 22 of the spacer 20 are provided with positioning recesses 23 and 24, respectively, which are identical in configuration, either of the positioning recesses 23 and 24 can be used as the engagement surface for positioning and holding the sensor assembly 11, so that it is not necessary to pay attention whether the spacer 20 is up-side-down or not during assembly. Also, it is not necessary that the positioning recesses 23 and 24 are at the center of the major surfaces 21 and 22 of the spacer 20. In fact the positiong recess 23 or 24 may be formed in some other position on the support unit 16 as long as the sensor assembly 11 can be supported at two separate positions.

Figure 3:
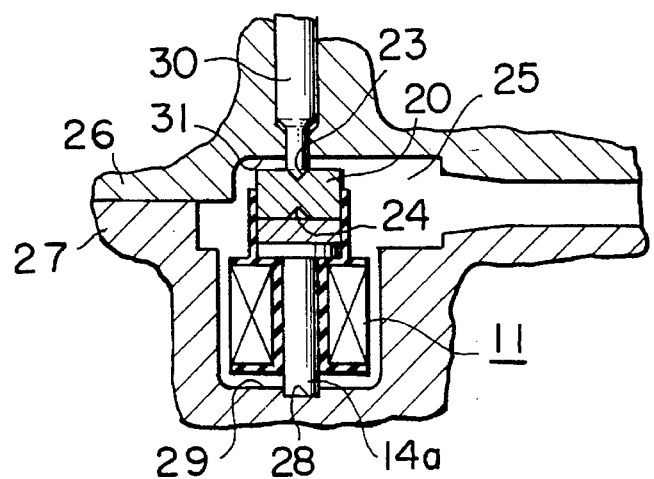
FIG. 3 is a sectional schematic view illustrating the manner in which the sensor assembly of the present invention is stably held within a mold cavity.
Figure 4:
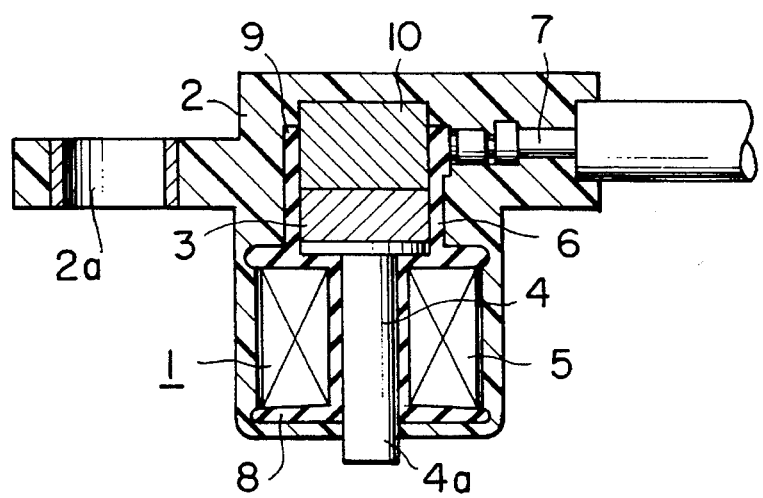
FIG. 4 is a sectional side view of a known magnetic pickup sensor.
Figure 5:
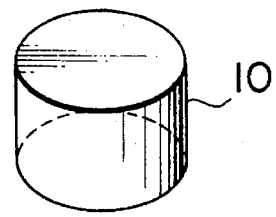
FIG. 5 is a perspective view of the permanent magnet illustrated in FIG. 4.

FIG. 3 illustrates one step of manufacturing the magnetic pickup sensor of the present invention, in which the sensor assembly 11 is mounted within a mold cavity 25 defined by mold dies 26 and 27 in the preparation of forming the molded resin housing 12 around the sensor assembly 11. It is seen that the permanent magnet 13, the iron core 14 and a sensor coil 15 are coaxially assembled in association with the support unit 16 including the coil bobbin 18, the sleeve 19 and the spacer 20 to form the sensor assembly 11. The sensor assembly 11 is placed within the mold cavity 25 defined by the mold dies 26 and 27 with the projecting end 14a of the iron core 14 of the sensor assembly 11 inserted into a recess 28 formed in a bottom wall 29 of the mold cavity 25. It is to be noted that the engagement surface or the recess 23 of the spacer 20 of the support unit 16 is engaged by a positioning pin 30 extending downwardly from a top wall 31 of the mold die 26. Thus, the sensor assembly 11 is supported at two opposite ends or two axially distant points thereof within the mold cavity, so that the sensor assembly 11 can be very firmly and stably supported within the mold cavity 25, ensuring that the sensor assembly 11 be reliably kept in its correct position within the mold cavity 25 even when the mold resin is introduced into the mold cavity 25. With the sensor assembly maintained in the illustrated position, the mold cavity 25 defined between the sensor assembly 11 and the mold dies 26 and 27 is filled with a resin for forming a mold resin housing 12. After the resin is cured, the mold dies 26 and 27 are opened and the magnetic pickup sensor is taken out from the mold cavity 25.

As has been described, the magnetic pickup sensor of the present invention comprises a sensor assembly and a molded resin housing disposed around the sensor assembly and defining an outer housing therefor. The iron core of the sensor assembly has one end projecting outwardly from the mold resin and the support unit has a positioning recess for being engaged by a portion of a mold die for positioning and holding the sensor assembly in place during molding of the housing.

Therefore, the sensor assembly 11 is positioned and supported within the mold cavity at two opposite ends of the sensor assembly, so that the position of the sensor assembly within the mold cavity is stably maintained and the sensor assembly cannot be tilted from its correct position with respect to the molded resin housing even when the resin is introduced into the mold cavity. Therefore, the positional accuracy of the iron core within the housing can be reliably maintained, ensuring the accurate measurement by the sensor assembly. Also, the manufacture of the magnetic pickup sensor is easy.

What is claimed is:

1. A method for manufacturing a magnetic pickup sensor, comprising the steps of:

a) preparing a support unit (16) having a positioning recess (23) adapted to be engaged for positioning the support unit within a mold;

b) assembling a magnet (13) for generating a magnetic flux, an iron core (14) and a pickup coil (15) into association with said support unit to provide a sensor assembly (11) for detecting a change in magnetic flux generated from said magnet and passing through said iron core;

c) placing said sensor assembly within a mold cavity (25) defined by a mold die (26,27), with one, outwardly projecting end (14a) of said iron core of said sensor assembly fitted within a recess (28) formed in a wall (29) of said mold cavity, and with said positioning recess of said support unit being engaged by the mold die for accurately positioning and holding said sensor assembly in place during molding of mold resin; and d) filling said mold cavity around said sensor assembly with a mold resin to form a mold resin housing therefor.

2. A method for manufacturing a magnetic pickup sensor as claimed in claim 1, wherein said support unit comprises a coil bobbin (18) disposed around said iron core and around which said pickup coil is wound, a sleeve (19) attached to said coil bobbin for holding said magnet in magnetic coupling relationship relative to said iron core, and a spacer (20) associated with said sleeve for holding said magnet within said sleeve, said spacer having said positioning recess.

3. A method for manufacturing a magnetic pickup sensor as claimed in claim 2, wherein said spacer is generally disc-shaped having a pair of opposing major planar surfaces (21,22), and wherein a positioning recess (23,24) is formed in each of said opposing planar surfaces.

4. A method for manufacturing a magnetic pickup sensor as claimed in claim 1, wherein the positioning recess is engaged by a positioning pin (30) of the mold die, extending outwardly from another wall (31) of the mold cavity.

5. A method for manufacturing a magnetic pickup sensor as claimed in claim 1, wherein the outwardly projecting core end and the positioning recess are axially aligned, and are disposed at opposite ends of the sensor assembly.

* * * * *